United States Patent
Tweet et al.

(10) Patent No.: US 7,241,670 B2
(45) Date of Patent: Jul. 10, 2007

(54) METHOD TO FORM RELAXED SIGE LAYER WITH HIGH GE CONTENT USING CO-IMPLANTATION OF SILICON WITH BORON OR HELIUM AND HYDROGEN

(75) Inventors: Douglas J. Tweet, Camas, WA (US); David R. Evans, Beaverton, OR (US); Sheng Teng Hsu, Camas, WA (US); Jer-Shen Maa, Vancouver, WA (US)

(73) Assignee: Sharp Laboratories of America, Inc, Camas, WA (US)

( * ) Notice: Subject to any disclaimer, the term of this patent is extended or adjusted under 35 U.S.C. 154(b) by 276 days.

(21) Appl. No.: 10/936,400

(22) Filed: Sep. 7, 2004

(65) Prior Publication Data

US 2006/0051960 A1    Mar. 9, 2006

(51) Int. Cl.
*H01L 21/26* (2006.01)
*H01L 21/42* (2006.01)

(52) U.S. Cl. ............... 438/513; 438/475; 438/933; 438/663; 257/E21.12; 257/E21.129; 257/E21.218; 257/E21.319

(58) Field of Classification Search ............... 438/513, 438/474, 475, 752, 753, 311, 514, 660, 933, 438/719, 659
See application file for complete search history.

(56) References Cited

U.S. PATENT DOCUMENTS

| | | | |
|---|---|---|---|
| 5,877,070 A | 3/1999 | Goesele et al. | |
| 6,562,703 B1 * | 5/2003 | Maa et al. | 438/518 |
| 6,573,126 B2 * | 6/2003 | Cheng et al. | 438/149 |
| 6,583,000 B1 | 6/2003 | Hsu et al. | |
| 6,699,764 B1 * | 3/2004 | Tweet et al. | 438/305 |
| 6,703,293 B2 * | 3/2004 | Tweet et al. | 438/518 |
| 6,746,902 B2 * | 6/2004 | Maa et al. | 438/149 |
| 6,780,796 B2 * | 8/2004 | Maa et al. | 438/795 |
| 6,852,652 B1 * | 2/2005 | Maa et al. | 438/933 |
| 6,992,025 B2 * | 1/2006 | Maa et al. | 438/795 |
| 7,067,430 B2 * | 6/2006 | Maa et al. | 438/705 |

OTHER PUBLICATIONS

Cai et al., *Strain relaxation and threading dislocation density in helium-implanted and annealed $Si_{1-x}Ge_x/Si(100)$ heterostructures*, J. Appl. Phys., vol. 95, pp. 5347-5351 (2004).
U.S. Appl. No. 10/345,551, filed Jan. 15, 2003, Hsu et al.
Hollander et al., *Strain relaxation of pseudomorphic $Si_{1-x}Ge_x/Si(100)$ heterostructures after $Si^+$ ion implantation*, J. Appl. Phys., vol. 96, pp. 1745-1747 (2004).

(Continued)

*Primary Examiner*—David Nhu
(74) *Attorney, Agent, or Firm*—Robert D. Varitz, PC

(57) ABSTRACT

A method of forming a relaxed SiGe layer having a high germanium content in a semiconductor device includes preparing a silicon substrate; depositing a strained SiGe layer; implanting ions into the strained SiGe layer, wherein the ions include silicon ions and ions selected from the group of ions consisting of boron and helium, and which further includes implanting H+ ions; annealing to relax the strained SiGe layer, thereby forming a first relaxed SiGe layer; and completing the semiconductor device.

27 Claims, 2 Drawing Sheets

OTHER PUBLICATIONS

Christiansen et al., *Strain relaxation mechanisms in $He^+$-implanted and annealed $Si_{1-x}Ge_x$ layers on Si(001) substrates*, Mat. Res. Soc. Symp. Proc. vol. 686, p. A1.6.1 (2002).

Herzog et al., *Si/SiGe n-MODFETs on Thin SiGe Virtual Substrates Prepared by Means of He Implantation*, IEEE Electron Device Letters, vol. 23, pp. 485-487 (2002).

Luysberg et al., *Effect of helium ion implantation and annealing on the relaxation behavior of pseudomorphic $Si_{1-x}Ge_x$ buffer layers on Si(100) substrates*, J. Appl. Phys., vol. 92, pp. 4290-4295 (2002).

Rim et al., *Strained Si NMOSFETs for High Performance CMOS Technology*, 2001 Symposium on VLSI Technology Digest of Technical Papers, p. 59, IEEE (2001).

Rim et al., *Fabrication and analysis of Deep submicron strained-Si N-MOSFETs*, IEEE Transactions on Electron Devices, vol. 47, 1406, (2000).

Trinkaus et al., *Strain relaxation mechanism for hydrogen-implanted $Si_{1-x}Ge_x/Si(100)$ heterostructures*, Appl. Phys. Lett., 76, 3552, (2000).

Mantl et al., *Strain relaxation of Epitaxial SiGe layers on Si (100) improved by hydrogen implantation*, Nuclear Instruments and Methods in Physics Research B 147, 29, (1999).

Tong et al., *A "smarter-cut" approach to low temperature silicon layer transfer*, Applied Physics Letters, vol. 72, p. 49 (1998).

Tong et al., *Low dose layer splitting for SOI preparation*, Proceedings of the 1998 IEEE International SOI Conference, p. 143, (1998).

Agarwal et al., *Efficient Production of Silicon-on-Insulator Films by Co-implantation of $He^+$ with $H^+$*, Proceedings of the 1997 IEEE International SOI Conference, p. 44, (1997).

Tong et al., *Low Temperature Si Layer Splitting*, Proceedings of the 1997 IEEE International SOI Conference, p. 126, (1997).

Weldon et al., *On the mechanism of the hydrogen-induced exfoliation of siliocn*, J. Va. Sc. technol. B. 15, 1065, (1997).

Weldon et al., *Mechanism of Silicon Exfoliation by Hydrogen Implantation and He, Li and Si Co-implantation*, Proceedings of the 1997 IEEE International SOI Conference, p. 124, (1997).

Follstaedt et al., *Cavity-dislocation interactions in Si-Ge and implications for heterostructure relaxation*, Appl. Phys. Lett., 69, 2059, (1996).

Nayak et al., *High-Mobility Strained-Si PMOSFET's [sic]*, IEEE Transactions on Electron Devices, vol. 43, 1709 (1996).

Rim et al., *Enhanced hole mobilities in surface-channel strained-Si p-MOSFETs*, 1995 IEDM Conference Proceedings, p. 517 (1995).

Welser et al., *Electron mobility enhancement in strained-Si N-type metal-oxide-semiconductor field-effect transistors*, 1994 IEDM Conference Proceedings, p. 373 (1994).IEEE EDL-15, #3, p. 100, (1994).

\* cited by examiner

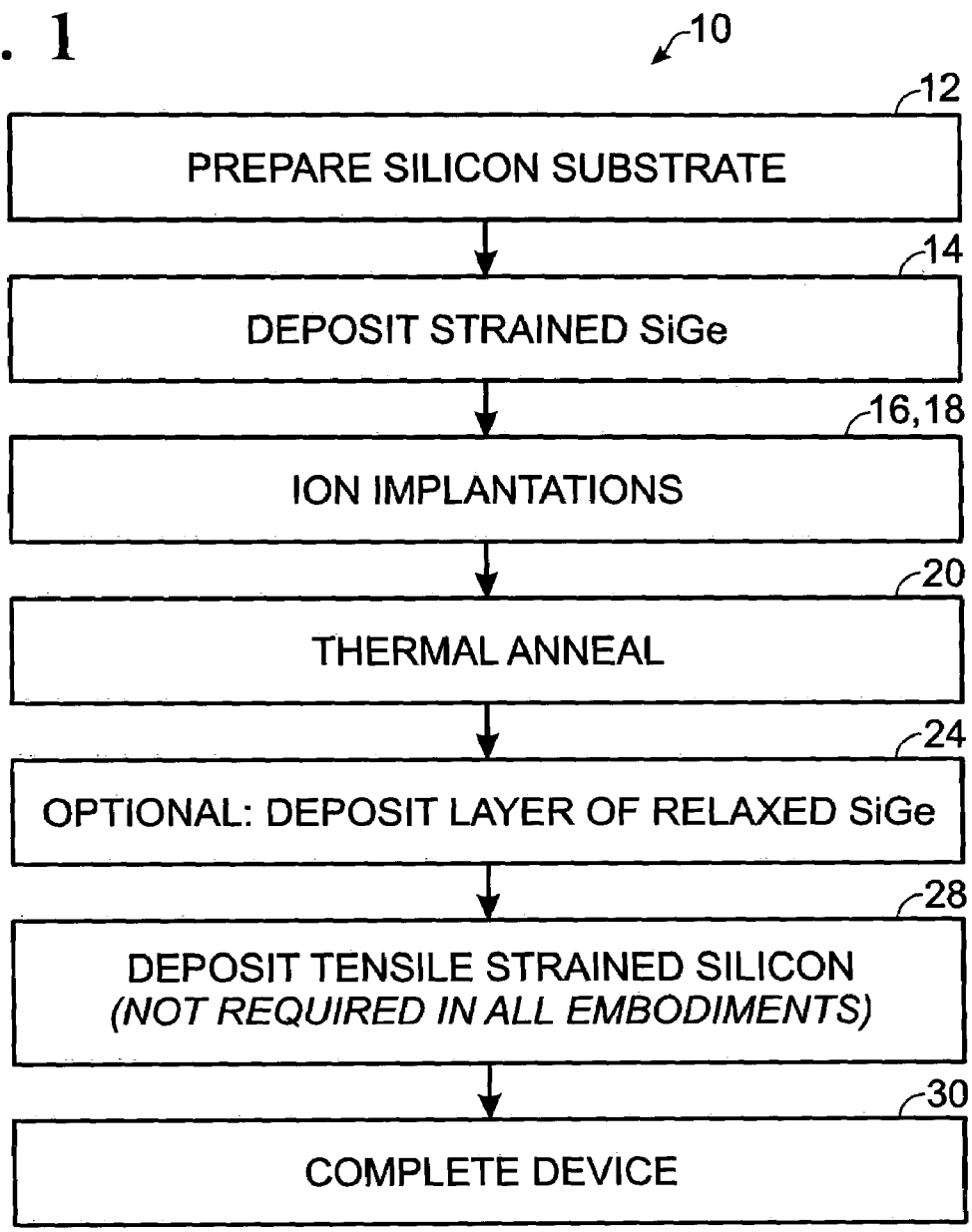
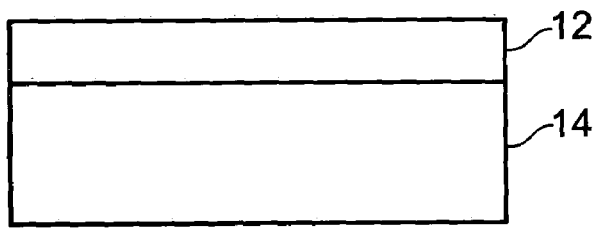

METHOD TO FORM RELAXED SIGE LAYER WITH HIGH GE CONTENT USING CO-IMPLANTATION OF SILICON WITH BORON OR HELIUM AND HYDROGEN

FIELD OF THE INVENTION

This invention relates to high speed CMOS integrated circuit, and specifically to fabrication of such a device having a relaxed SiGe layer therein.

BACKGROUND OF THE INVENTION

In enhanced mobility MOSFET device applications thick, relaxed $Si_{1-x}Ge_x$, buffer layers have been used as virtual substrates for thin, strained silicon layers to increase carrier mobility for both NMOS Welser et al., *Electron mobility enhancement in strained-Si N-type metal-oxide-semiconductor transistors,* 1994 IEDM Conference Proceedings, p. 373 (1994).IEEE EDL-15, #3, p. 100, (1994); Rim et al., (Rim I) *Fabrication and analysis of Deep submicron strained-Si N-MOSFETs,* IEEE Transactions on Electron Devices, Vol 47, 1406, (2000); and Rim et al., (Rim II) *Strained Si NMOSFETs for High Performance CMOS Technology,* 2001 Symposium on VLSI Technology Digest of Technical Papers, p. 59, IEEE 2001; and PMOS, Rim et al., (Rim III) *Enhanced hole mobilities in surface-channel strained-Si p-MOSFETs,* 1995 IEDM Conference Proceedings, p. 517 (1995); and Nayak et al., *High-Mobility Strained-Si PMOSFET's [sic],* IEEE Transactions on Electron Devices, Vol. 43, 1709 (1996). Compared with bulk silicon devices, enhancement in electron mobility of 70% for devices with $L_{eff}$<70 nm has been reported, Rim I supra. Enhancements of up to 40% in high-field hole mobility for long-channel devices have also been found, Nayak et al., supra.

The main current technique to produce a high quality relaxed $Si_{1-x}Ge_x$ buffer layer is the growth of a several μm thick, compositionally graded layer, Rim I, supra, and Nayak et al., supra. However, the density of threading dislocations is still high, e.g., >$10^6/cm^2$. In addition, the integration of several μm $Si_{1-x}Ge_x$ into device fabrication is not practical.

An alternative method to efficiently relax strained SiGe layers on silicon is to implant helium followed by an anneal step. Cavities formed in silicon and germanium, and their alloys, by helium implantation and annealing have been found to have a strong short-range, attractive interaction with dislocations. Introducing cavities at the SiGe/Si interface greatly enhances the relaxation rate and alters dislocation microstructures, Follstaedt et al., *Cavity-dislocation interactions in Si—Ge and implications for heterostructure relaxation,* Appl. Phys. Lett., 69, 2059, 1996. He implantation and subsequent annealing has been used to achieve ~70% relaxation of 100 nm thick $Si_{0.7}Ge_{0.3}$ films with a threading dislocation density as low as $10^7/cm^2$ Luysberg et al., *Effect of helium ion implantation and annealing on the relaxation behavior of pseudomorphic $Si_{1-x}Ge_x$, buffer layers on Si(100) substrates,* J. Appl. Phys., vol. 92, pp 4290–4295 (2002). These films were successfully used to fabricate high performance n-type modulation-doped FETs, Herzog et al., *Si/SiGe n-MODFETs on Thin SiGe Virtual Substrates Prepared by Means of He Implantation,* IEEE Electron Device Letters, vol. 23, pp 485–487 (2002). Meanwhile, research has continued on the relaxation mechanisms of SiGe after He+ implantation and annealing, Christiansen et al., *Strain relaxation mechanisms in He+-implanted and annealed $Si_{1-x}Ge_x$ layers on Si(100) substrates,* Mat. Res. Soc. Symp. Proc. Vol. 686, p. A1.6.1 (2002); Cai et al., *Strain relaxation and threading dislocation density in helium-implanted and annealed $Si_{1-x}Ge/Si(100)$ heterostructures,* J. Appl. Phys., vol. 95, pp 5347–5351 (2004). Another recently published alternative method for the relaxation of SiGe films on Si is the implantation of $Si^+$ ions. Doses of less than $20^{14}/cm^2$ produce comparable results to those achieved by $He^+$ implantation using much higher doses of 1–2×$16^{16}/cm^2$, Hollander et al., *Strain relaxation of pseudomorphic $Si_{1-x}Ge_x/Si$ (100) heterostructures after $Si^+$ ion implantation,* J. Appl. Phys., vol. 96, pp 1745–1747 (2004).

Hydrogen implantation has been found to induce exfoliation of silicon and cause shearing of macroscopic layers of silicon, Weldon et al, *On the mechanism of the hydrogen-induced exfoliation of silicon,* J. Va. Sc. technol. B. 15, 1065, (1997). This has been incorporated into the fabrication of high-quality silicon-on-insulator (SOI) wafers, and is known as the SmartCut™ process. In recent publications by a collaboration of S. Mantl et al. and H. Trinkaus et al., reports of the advantages of using hydrogen implantation to increase the degree of SiGe relaxation and to reduce the density of threading dislocations, Mantl et al., *Strain relaxation of Epitaxial SiGe layers on Si (100)improved by hydrogen implantation,* Nuclear Instruments and Methods in Physics Research B 147, 29, (1999); Trinkaus et al., *Strain relaxation mechanism for hydrogen-implanted $Si_{1-x}Ge/Si(100)$ heterostructures,* Appl. Phys. Lett., 76, 3552, (2000), have been made. However, the collaboration only reported the relaxation of a SiGe having a thickness of between 2000 Å–2500 Å, with up to 22% germanium. SiGe having a 2000 Å–2500 Å thickness is not sufficient for device application. Also, a higher germanium content is desirable. Meanwhile, we have also made thicker films having higher germanium content, e.g., 30%, U.S. Pat. No. 6,746,902, to Maa et al., granted Jun. 8, 2004, for *Method to Form Relaxed SiGe Layer with High Ge Content,* and for reducing leakage current through proper isolation, U.S. patent application Ser. No. 10/345,551, of Hsu et al., filed Jan. 15, 2003, for *Method of Reducing Si1-xGex CMOS Leakage Current*; and U.S. Pat. No. 6,583,000 B1, granted Jun. 24, 2004, to Hsu et al. for *Process Integration of $Si_{1-x}Ge_x$ CMOS with $Si_{1-x}Ge_x$, Relaxation After STI Formation.*

In addition to the hydrogen implantation SmartCu™ process, other methods for splitting wafers for application in SOI fabrication have been proposed and developed. These methods all require the co-deposition of some other species together with hydrogen. By so doing, the hydrogen dose may be reduced, and the annealing temperature and time may also be reduced, resulting in a lower cost and a higher quality wafer. Co-implantation of boron (5e12/$cm^2$ to 5e15/$cm^2$) and $H_2^+$ ions (5e16/$cm^2$) at energies to ensure overlap of the two species is described in Tong et al., *Low Temperature Si Layer Splitting,* Proceedings of the 1997 IEEE International SOI Conference, p. 126, (1997); Tong et al., *A "smarter-cut" approach to low temperature silicon layer transfer,* Applied Physics Letters, vol 72, p. 49 (1998); U.S. Pat. No. 5,877,070, to Goesele et al., granted Mar. 2, 1999, for *Method for the transfer of thin layers of monocrystalline material to a desirable substrate*; and Tong et al., *Low dose layer splitting for SOI preparation,* Proceedings of the 1998 IEEE International SOI Conference, p. 143, (1998). This method was most effective at reducing anneal temperature and times when a low temperature anneal was performed, e.g., 250° C. for 10 minutes, before any higher temperature annealing steps. Also, electrically inactive boron was more effective than electrically active boron. Boron is thought to be a good choice for co-implantation with hydrogen because it generates a large number of point defects per ion and the boron atoms may trap a cluster of hydrogen atoms. Both effects assist in the formation of platelets and microcracks, which are essential to the SmartCut™ process. The references also suggest using heavily boron-doped silicon substrates, instead of implanting the boron. Based on this, the co-implantation of boron with molecular hydrogen ($H_2^+$), followed by an anneal as a means of relaxing a SiGe film grown on a silicon substrate is disclosed in U.S. Pat. No. 6,562,703 B1, to Maa et al, granted May 13, 2003, for *Molecular Hydrogen Implantation Method for Forming a Relaxed Silicon Germanium Layer with High Germanium Content.*

Helium has also been co-implanted with silicon, Agarwal et al., *Efficient Production of Silicon-on-Insulator Films by Co-implantation of $He^+$ with $H^+$*, Proceedings of the 1997 IEEE International SOI Conference, p. 44, (1997); Weldon et al., *Mechanism of Silicon Exfoliation by Hydrogen Implantation and He, Li and Si Co-implantation*, Proceedings of the 1997 IEEE International SOI Conference, p. 124, (1997). A dose of 1e16/cm² helium with 7.5e15/cm²H implantation was found to be as effective as a 6e16/cm²H SmartCut™ process, reducing the total implant dose by 70%, Agarwal et al., supra.

SUMMARY OF THE INVENTION

A method of forming a relaxed SiGe layer having a high germanium content in a semiconductor device includes preparing a silicon substrate; depositing a strained SiGe layer; implanting ions into the strained SiGe layer, wherein the ion includes silicon ions and ions selected from the group ions consisting of boron and helium, and which further includes implanting H+ ions; annealing to relax the strained SiGe layer, thereby forming a first relaxed SiGe layer; and completing the semiconductor device.

It is an object of the invention to provide a method of fabricating a thick, e.g., 100 nm to 500 nm, relaxed, smooth SiGe film having a high germanium content, e.g., >20% to 30%+, as a buffer layer for a tensile strained silicon film to be used for high speed MOSFET applications.

Another object of the method of the invention is to produce such a film using reduced hydrogen implantation dose.

A further object of the invention is to produce such a film using a reduced annealing temperature and time.

Another object of the invention is to provide a method of fabricating such a film which is low in cost and which has improved film properties.

This summary and objectives of the invention are provided to enable quick comprehension of the nature of the invention. A more thorough understanding of the invention may be obtained by reference to the following detailed description of the preferred embodiment of the invention in connection with the drawings.

BRIEF DESCRIPTION OF THE DRAWINGS

FIG. 1 is a block diagram of the method of the invention.

FIGS. 2–6 depict successive steps in the method of the invention of SiGe and silicon cap deposition.

DETAINED DESCRIPTION OF THE PREFERRED EMBODIMENTS

The method of the invention results in a thick, e.g., 100 nm to 500 nm, relaxed, smooth SiGe film having a high germanium content, e.g., >20% to 30% or more, for use as a buffer layer for a tensile strained silicon film, all of which are used in high-speed MOSFET applications. Our previous work, and that of others, has demonstrated that hydrogen implantation is effective for producing such films. However, now-conventional hydrogen implantation is both costly and requires time-consuming post-implantation steps. The purpose of the present invention is to reduce the hydrogen implantation dose and/or the annealing temperature and time to both reduce cost and improve the final film properties.

The method of the invention is depicted generally in FIG. 1 at 10, and is shown in sequential steps depicted in FIGS. 2–6. Referring now to FIGS. 1 and 2, a silicon substrate is prepared 12, and a layer of strained SiGe 14, having a thickness of between about 100 nm to 500 nm, is deposited on silicon substrate 12. The germanium content of SiGe layer 14 may be 20% to 30% or greater. A graded germanium profile may also be used in layer 14. The growth conditions and source gases are selected to minimize surface roughness, while ensuring good crystallinity. This generally requires low temperature growth, e.g., 400° C. to 600° C., to produce a metastable, strained SiGe film.

Figure 3:
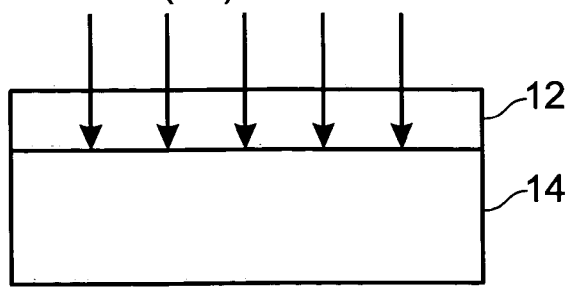

Referring to FIGS. 1 and 3, a combination of boron ions and silicon ions are implanted into the structure 16 and H+ ions are implanted into the structure 18. Either dopant may be the first implanted species. Either way, the implant ranges are the same. A combination of silicon ions and helium ions may also be used in place of boron/silicon. The boron dose may have a wide range, e.g., between about 5e12/cm² to 1e15/cm². The silicon ions have a similar range, as does helium when used. Generally, the higher the boron dose, the smaller the H+ dose. The dose of H+ is in the range of between about 5e14/cm² to 3e16/cm², and, as previously noted, is dependant on the boron dose. The implant energies depend on the thickness of strained SiGe layer 14, and are selected so that the boron or helium and hydrogen implantation ranges are similar. To avoid contamination in the implantation steps, a thin sacrificial silicon oxide, in the range of between about 50 Å to 300 Å, is deposited on SiGe layer 14.

Figure 4:
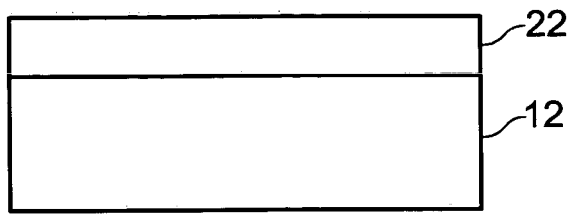

Referring to FIGS. 1 and 4, a thermal anneal step 20 is performed to convert strained SiGe layer 14 to a relaxed SiGe layer 22. This may be a two step process: low temperature anneal followed by a higher temperature anneal. Annealing is performed in an inert ambient, such as argon, at a temperature in the range of between about 650° C. to 950° C., for between about one minutes to thirty minutes. Alternatively, a low temperature pre-anneal may be used, e.g., 250° C. for about 10 minutes, followed by the higher temperature anneal.

Figure 5:
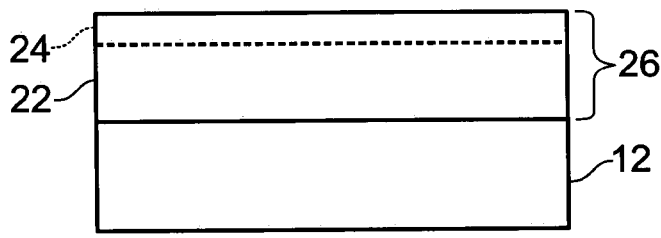

Referring to FIGS. 1 and 5, if required to achieve the desired SiGe thickness, a layer of relaxed SiGe 24, also referred to herein as the second SiGe layer, may be deposited on now relaxed SiGe layer 22, forming a relaxed SiGe layer 26. Layer 24 may be 100 nm or greater in thickness.

Figure 6:
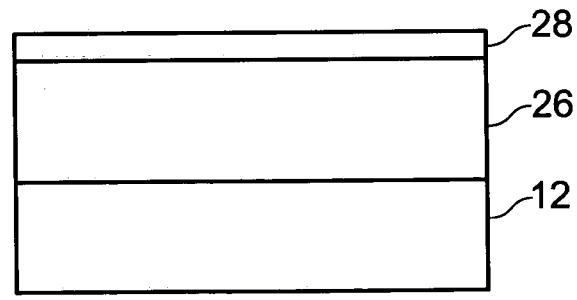

Referring now to FIG. 6, a layer of tensile strained silicon 28 is deposited to a thickness of between about 5 nm to 30 nm on combined relaxed SiGe layer 26. The device being fabricated is then completed, 30.

An alternate embodiment of the method of the invention is to grow a strained SiGe layer 14 to more than 300 nm thick, and to provide layer 14 with a graded germanium profile, having germanium content at surface of greater than 20%. Boron and silicon implantation in this case may have a dose of about $1e14/cm^2$, and H+ implantation has a dose of about $1e16/cm^2$; or H+ implant may be performed first, followed by boron/silicon implantation. Again, helium/silicon may be substituted for boron/silicon, using similar implant parameters. Annealing in these conditions is at about 250° C. for about 10 minutes in an argon atmosphere, followed by an anneal at about 800° C. in argon for about 10 minutes. A further variation of the method of the invention includes growth of a layer of tensile strained epi-silicon as a cap, or channel, to a thickness of between about 5 nm to 30 nm. In this case, there is no requirement for deposition of tensile strained silicon layer 28.

A further variation of the method of the invention is to again grow a SiGe layer, having a graded germanium profile having germanium content at surface of greater than 20%, to a thickness of at least 300 nm, followed by boron implantation, e.g., $1e14/cm^2$, followed by H+ implantation, e.g., $1e16/cm^2$; or H+ followed by boron implantation. The structure is then annealed at about 800° C. in argon for about 10 minutes. A tensile epi-silicon cap, or channel, is grown to a thickness of between about 5 nm to 30 nm. In this embodiment of the method of the invention, there is no need to deposit second SiGe layer 24.

Figure 7:
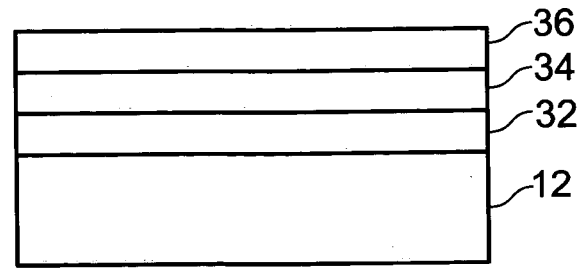
FIG. 7 depicts an alternate step in practicing the method of the invention.

Another variation of the preferred method of the invention, and now referring to FIG. 7, is to grow a first SiGe layer 32 on silicon substrate 12, wherein layer 32 has either a constant or graded germanium profile, implant boron or helium and hydrogen, according to parameters previously described herein, and perform a two-step anneal, wherein the first anneal step is performed at about 250° C. for about 10 minute in argon, followed by second anneal at about 800° C. in argon for about 10 minutes. A second SiGe layer 34, again having either a constant or a graded germanium profile, with a germanium content at the surface of greater than 20%, is grown on first SiGe layer 32. A tensile epi-silicon cap, or channel, layer 36 is grown to a thickness of between about 5 nm to 30 nm, resulting in a total SiGe layer thickness of 300 nm or greater.

Another embodiment of the method of the invention includes growing a first SiGe layer 32, having either a constant or a graded germanium profile; ion implantation; a first anneal step at about 800° C. in argon for about 10 minutes; growth of second SiGe layer 34, having either a constant or a graded germanium profile, and having a germanium content at surface greater than 20%; followed by growth of tensile epi-silicon cap, or channel, 36 to a thickness of between about 5 nm to 30 nm, resulting in a total SiGe layer thickness of about 300 nm or greater.

Thus, a method to form relaxed SiGe layer with high germanium content using co-implantation of boron or helium and hydrogen has been disclosed. It will be appreciated that further variations and modifications thereof may be made within the scope of the invention as defined in the appended claims.

We claim:

1. A method of forming a relaxed SiGe layer having a high germanium content in a semiconductor device, comprising:
preparing a silicon substrate;
depositing a strained SiGe layer;
implanting ions into the strained SiGe layer;
annealing to relax the strained SiGe layer, thereby forming a first relaxed SiGe layer, wherein said annealing includes annealing in a two-step process wherein a first step includes annealing at about 250° C. for about 10 minutes, followed a second step anneal at a temperature of between about 650° C. to 950° C. for between about one minutes to thirty minutes; and
completing the semiconductor device.

2. The method of claim 1 which further includes, after said annealing, depositing a second layer of relaxed SiGe on the first relaxed SiGe layer to form a combined relaxed SiGe layer; and which further includes depositing a layer of tensile strained silicon on the combined relaxed SiGe layer.

3. The method of claim 1 wherein said depositing a layer of strained SiGe includes depositing a layer of SiGe to a thickness of between about 100 nm to 500 nm at a deposition temperature of between about 400° C. to 600° C. to produce a metastable, strained SiGe layer.

4. The method of claim 3 wherein said depositing a layer of strained SiGe includes depositing a layer of SiGe taken from the group of SiGe layers having a germanium content of between about 20% and 30%+ and having a graded germanium content.

5. The method of claim 1 wherein said implanting ions into the strained SiGe layer includes depositing silicon ions and ions taken from the group of ions consisting of boron and helium, and which further includes implanting H+ ions.

6. The method of claim 5 wherein the dose for boron or helium ions is between about $5e\ 12/cm^2$ to $1e15/cm^2$; wherein the dose for silicon ions is between about $5e12/cm^2$ to $1e15/cm^2$; and wherein the H+ dose is in the range of between about $5e\ 14/cm^2$ to $3e16/cm^2$.

7. The method of claim 1 wherein said annealing includes annealing in an inert ambient atmosphere at a temperature in the range of between about 650° C. to 950° C. for between about one minutes to thirty minutes.

8. The method of claim 1 wherein said depositing a strained SiGe layer includes growing a strained SiGe layer to a thickness of about 300 nm thick, wherein the strained SiGe layer has a graded germanium profile, having germanium content at surface of greater than 20%; and wherein said annealing includes annealing at about 250° C. for about 10 minutes in an argon atmosphere, followed by an anneal at about 800° C. in argon for about 10 minutes.

9. The method of claim 8 which further includes growing a layer of tensile strained epi-silicon to a thickness of between about 5 nm to 30 nm.

10. The method of claim 1 wherein said depositing a strained SiGe layer includes growing a strained SiGe layer to a thickness of about 300 nm thick, having a graded germanium profile having germanium content at surface of greater than 20%, and wherein said annealing includes annealing at about 800° C. in argon for about 10 minutes; and which further includes growing a tensile epi-silicon layer to a thickness of between about 5 nm to 30 nm.

11. The method of claim 1 wherein said depositing a strained SiGe layer includes growing a first SiGe layer on the silicon substrate, wherein the first SiGe layer has a germanium profile taken from the group of germanium profiles consisting of constant and graded, and wherein said annealing includes a two-step anneal, wherein the first anneal step is performed at about 250° C. for about 10 minute in argon, followed by second anneal at about 800° C. in argon for about 10 minutes; and wherein a second SiGe layer, having a constant or a graded germanium profile, with a germanium content at the surface of greater than 20%, is grown on the first SiGe layer; and which includes growing a tensile epi-silicon layer to a thickness of between about 5 nm to 30 nm, resulting in a total SiGe layer thickness of 300 nm or greater.

12. The method of claim 1 wherein depositing a SiGe layer includes growing a first SiGe layer, wherein the first SiGe layer has a germanium profile taken from the group of germanium profiles consisting of constant and graded; and wherein said annealing includes annealing at about 800° C. in argon for about 10 minutes; growing second SiGe layer, having a constant or a graded germanium profile, and having a germanium content at surface greater than 20%; and growing a tensile epi-silicon layer to a thickness of between about 5 nm to 30 nm, resulting in a total SiGe layer thickness of about 300 nm or greater.

13. A method of forming a relaxed SiGe layer having a high germanium content in a semiconductor device, comprising:
   preparing a silicon substrate;
   depositing a strained SiGe layer, wherein said depositing a strained SiGe layer includes growing a strained SiGe layer to a thickness of about 300 nm thick, wherein the strained SiGe layer has a graded germanium profile, having germanium content at surface of greater than 20%;
   implanting ions into the strained SiGe layer, wherein the ions include silicon ions and ions selected from the group of ions consisting of boron and helium, and which further includes implanting H+ ions;
   annealing to relax the strained SiGe layer, thereby forming a first relaxed SiGe layer, wherein said annealing includes annealing at about 250° C. for about 10 minutes in an argon atmosphere, followed by an anneal at about 800° C. in argon for about 10 minutes; and
   completing the semiconductor device.

14. The method of claim 13 which further includes, after said annealing, depositing a second layer of relaxed SiGe on the first relaxed SiGe layer to form a combined relaxed SiGe layer; and which further includes depositing a layer of tensile strained silicon on the combined relaxed SiGe layer.

15. The method of claim 13 wherein said depositing a layer of strained SiGe includes depositing a layer of SiGe to a thickness of between about 100 nm to 500 nm at a deposition temperature of between about 400° C. to 600° C. to produce a metastable, strained SiGe layer; and having a germanium content of between about 20% and 30%+, or which includes depositing a SiGe layer having a graded germanium content.

16. The method of claim 13 wherein the dose for boron, helium and silicon ions is between about $5e12/cm^2$ to $1e15/cm^2$; and wherein the H+ dose is in the range of between about $5e14/cm^2$ to $3e16/cm^2$.

17. The method of claim 13 wherein said annealing includes annealing in an inert ambient atmosphere at a temperature in the range of between about 650° C. to 950° C. for between about one minutes to thirty minutes, or annealing in a two-step process wherein a first step includes annealing at about 250° C. for about 10 minutes, followed a second step anneal at a temperature of between about 650° C. to 950° C. for between about one minutes to thirty minutes.

18. The method of claim 13 which further includes growing a layer of tensile strained epi-silicon to a thickness of between about 5 nm to 30 nm.

19. The method of claim 13 wherein said depositing a strained SiGe layer includes growing a strained SiGe layer to a thickness of about 300 nm thick, having a graded germanium profile having germanium content at surface of greater than 20%, and wherein said annealing includes annealing at about 800° C. in argon for about 10 minutes; and which further includes growing a tensile epi-silicon layer to a thickness of between about 5 nm to 30 nm.

20. The method of claim 13 wherein said depositing a strained SiGe layer includes growing a first SiGe layer on the silicon substrate, wherein the first SiGe layer has a germanium profile taken from the group of germanium profiles consisting of constant and graded, and wherein said annealing includes a two-step anneal, wherein the first anneal step is performed at about 250° C. for about 10 minute in argon, followed by second anneal at about 800° C. in argon for about 10 minutes; and wherein a second SiGe layer, having a constant or a graded germanium profile, with a germanium content at the surface of greater than 20%, is grown on the first SiGe layer; and which includes growing a tensile epi-silicon layer to a thickness of between about 5 nm to 30 nm, resulting in a total SiGe layer thickness of 300 nm or greater.

21. The method of claim 13 wherein depositing a SiGe layer includes growing a first SiGe layer, wherein the first SiGe layer has a germanium profile taken from the group of germanium profiles consisting of constant and graded; and wherein said annealing includes annealing at about 800° C. in argon for about 10 minutes; growing second SiGe layer, having either a constant or a graded germanium profile, and having a germanium content at surface greater than 20%; and growing a tensile epi-silicon layer to a thickness of between about 5 nm to 30 nm, resulting in a total SiGe layer thickness of about 300 nm or greater.

22. A method of forming a relaxed SiGe layer having a high germanium content in a semiconductor device, comprising:
   preparing a silicon substrate;
   depositing a strained SiGe layer;
   implanting ions into the strained SiGe layer, wherein the ions include silicon ions and ions selected from the group of ions consisting of boron and helium, and which further includes implanting H+ ions;
   annealing to relax the strained SiGe layer, thereby forming a first relaxed SiGe layer, wherein said annealing includes annealing in a two-step process wherein a first step includes annealing at about 250° C. for about 10 minutes, followed a second step anneal at a temperature of between about 650° C. to 950° C. for between about one minutes to thirty minutes;
   depositing a second layer of relaxed SiGe on the first relaxed SiGe layer to form a combined relaxed SiGe layer;
   depositing a layer of tensile strained silicon on the combined relaxed SiGe layer; and
   completing the semiconductor device.

23. The method of claim 22 wherein said depositing a layer of strained SiGe includes depositing a layer of SiGe to a thickness of between about 100 nm to 500 nm at a deposition temperature of between about 400° C. to 600° C. to produce a metastable, strained SiGe layer; and having a germanium content of between about 20% and 30%+, or which includes depositing a SiGe layer having a graded germanium content.

24. The method of claim 22 wherein the dose for boron, helium and silicon ions is between about $5e12/cm^2$ to $1e15/cm^2$; and wherein the H+ dose is in the range of between about $5e14/cm^2$ to $3e16/cm^2$.

25. The method of claim 22 wherein said annealing includes annealing in an inert ambient atmosphere at a temperature in the range of between about 650° C. to 950° C. for between about one minutes to thirty minutes.

26. The method of claim 22 wherein said depositing a strained SiGe layer includes growing a first SiGe layer on the silicon substrate, wherein the first SiGe layer has a germanium profile taken from the group of germanium profiles consisting of constant and graded, and wherein said annealing includes a two-step anneal, wherein the first anneal step is performed at about 250° C. for about 10 minute in argon, followed by second anneal at about 800° C. in argon for about 10 minutes; and wherein a second SiGe layer, having a constant or a graded germanium profile, with a germanium content at the surface of greater than 20%, is grown on the first SiGe layer; and which includes growing a tensile epi-silicon layer to a thickness of between about 5 nm to 30 nm, resulting in a total SiGe layer thickness of 300 nm or greater.

27. The method of claim 22 wherein depositing a SiGe layer includes growing a first SiGe layer, wherein the first SiGe layer has a germanium profile taken from the group of germanium profiles consisting of constant and graded; and wherein said annealing includes annealing at about 800° C. in argon for about 10 minutes; growing second SiGe layer, having a constant or a graded germanium profile, and having a germanium content at surface greater than 20%; and growing a tensile epi-silicon layer to a thickness of between about 5 nm to 30 nm, resulting in a total SiGe layer thickness of about 300 nm or greater.

* * * * *